US011520954B2

(12) United States Patent
Kondo et al.

(10) Patent No.: US 11,520,954 B2
(45) Date of Patent: Dec. 6, 2022

(54) SIMULATION MANAGEMENT METHOD, SIMULATION SYSTEM, AND PROGRAM

(71) Applicant: Hitachi, Ltd., Tokyo (JP)

(72) Inventors: Nobukazu Kondo, Tokyo (JP); Tsunehiko Baba, Tokyo (JP); Jumpei Okoshi, Tokyo (JP)

(73) Assignee: Hitachi, Ltd., Tokyo (JP)

(*) Notice: Subject to any disclaimer, the term of this patent is extended or adjusted under 35 U.S.C. 154(b) by 320 days.

(21) Appl. No.: 16/816,699

(22) Filed: Mar. 12, 2020

(65) Prior Publication Data

US 2020/0311324 A1 Oct. 1, 2020

(30) Foreign Application Priority Data

Mar. 27, 2019 (JP) .................................. JP2019-60853

(51) Int. Cl.
G06F 30/20 (2020.01)
B62D 6/00 (2006.01)
B62D 5/10 (2006.01)

(52) U.S. Cl.
CPC .............. G06F 30/20 (2020.01); B62D 5/10 (2013.01); B62D 6/00 (2013.01)

(58) Field of Classification Search
CPC .............. B62D 6/00; B62D 5/10; G06F 30/20
See application file for complete search history.

(56) References Cited

U.S. PATENT DOCUMENTS

| 2015/0254125 A1* | 9/2015 | Kakui ................. G06F 11/3419 714/47.3 |
| 2017/0104819 A1* | 4/2017 | Anastasi ................. G06F 9/455 |
| 2017/0261403 A1* | 9/2017 | Hiruta .................... G01M 15/14 |
| 2019/0057020 A1 | 2/2019 | Suzuki et al. |
| 2019/0304322 A1* | 10/2019 | Delisle ..................... G09B 9/08 |

FOREIGN PATENT DOCUMENTS

| JP | 2008305019 A | 12/2008 |
| JP | 2010-102372 A | 5/2010 |
| WO | 2017179120 A1 | 10/2017 |

OTHER PUBLICATIONS

Office Action dated May 31, 2022 from counterpart JP Patent Application No. 2019-060853, 24 pages.

* cited by examiner

Primary Examiner — Chuen-Meei Gan
(74) Attorney, Agent, or Firm — Procopio, Cory, Hargreaves & Savitch LLP

(57) ABSTRACT

Reusable information is extracted from a result of executing a simulation of a plurality of models.
A simulation management method for managing data for use in a simulation by a management device having a processor and a memory, the method including: executing a simulation using a model and data, by a simulator; extracting intermediate data indicating that an internal state of the model that is being simulated matches a predetermined state, by the management device; and holding the extracted intermediate data as useful intermediate data, by the management device.

10 Claims, 9 Drawing Sheets

FIG. 6

70 MODEL STATE MANAGEMENT TABLE

| ECU CATEGORY | | State model (file ID) | USAGE RESTRICTIONS, etc. |
|---|---|---|---|
| TYPE NAME | Ver. | | |
| EU01 | V001 | α (V001_1) | |
| EU02 | V021 | α (V021_1) | |
| | V021 | β (V021_2) | |
| | V021 | γ (V021_3) | |
| EU02X | V022 | α (V022_1) | |
| | V022 | β (V022_2) | |
| | V022 | γ (V022_3) | |
| EU02X | V023 | α (V023_1) | |
| | V023 | β (V023_2) | |
| | V023 | γ (V023_3) | |
| ⋮ | ⋮ | ⋮ | |

7 MODEL TABLE

MECHANISM (HYDRAULIC MECHANISM)
TYPE NAME : MM002P
File ID : MD_002P

MECHANISM (STEERING)
TYPE NAME : MS018Y
File ID : MD_018Y

⋮

TORQUE SENSOR
TYPE NAME : ST045C
File ID : MD_45C

⋮

75 — ECU
76 — TYPE NAME: EU02X
77 — File ID : MD_EU02X

⋮

SIMULATION MANAGEMENT METHOD, SIMULATION SYSTEM, AND PROGRAM

CLAIM OF PRIORITY

The present application claims priority from Japanese patent application JP2019-60853 filed on Mar. 27, 2019, the content of which is hereby incorporated by reference into this application.

FIELD OF THE INVENTION

1. Field of the Invention

The present invention relates to a computing machine system that performs a simulation.

2. Description of the Related Art

With the advancement of internet of things (IoT), expectations for diverse solutions to business challenges such as a productivity growth and a failure rate reduction by integrally analyzing sensor data about factories or the like, on-site data about operational technology (OT), and simulation data about production apparatuses are growing.

While a simulation technology with a plurality of simulators interlocked with one another is advancing, the sophistication of devices is also rapidly pursued; thus, an enormous number of verification man-hours by simulations is one factor for disturbing prompt commercialization.

As a technique for improving simulation efficiency, a technique disclosed in JP-2010-102372-A is known. JP-2010-102372-A discloses the technique for acquiring a snapshot of a simulation in a case in which a certain condition is satisfied, and using the snapshot at a time of re-executing the simulation.

In a case of interlocking a plurality of models and performing a simulation, the simulation is often executed upon replacement of the models. However, the snapshot in the conventional technique is only recorded information about the overall simulation at a certain time, so that it is disadvantageously impossible to resume the simulation by replacing the models.

Owing to this, the conventional technique described above has problems that it is necessary to start over a simulation from the beginning and it is impossible to achieve a reduction in simulation execution time in the case of replacing models.

SUMMARY OF THE INVENTION

The present invention has been achieved in the light of the problems, and an object of the present invention is to extract reusable information from a result of executing a simulation of a plurality of models and reusing the information.

A simulation management method according to one aspect of the present invention is a simulation management method for managing data for use in a simulation by a management device including a processor and a memory, the method including: executing a simulation using a model and data, by a simulator; extracting intermediate data indicating that an internal state of the model that is being simulated matches a predetermined state, by the management device; and holding the extracted intermediate data as useful intermediate data, by the management device.

Therefore, according to the present invention, the intermediate data in a predetermined state (standby state) is extracted per model from intermediate data about the executed simulation, and the extracted intermediate data is stored as the useful intermediate data. It is thereby possible to start a simulation from the standby state in the middle of a scenario definition by selecting the useful intermediate data about each model. Furthermore, since the useful intermediate data can be selected per model, it is possible to shorten time required for the simulation by changing a combination of models and performing the simulation in the middle of the scenario definition.

Details of at least one embodiment of a subject disclosed in the present specification will be described hereinafter with reference to the accompanying drawings. Other features, aspects, and advantages of the disclosed subject are made clear from the following disclosure, drawings, and claims.

BRIEF DESCRIPTION OF THE DRAWINGS

FIG. 6 depicts the embodiment of the present invention and depicts an example of a model state management table;

FIG. 7 depicts the embodiment of the present invention and depicts an example of a model table;

DESCRIPTION OF THE PREFERRED EMBODIMENT

An embodiment of the present invention will be described hereinafter with reference to the accompanying drawings.

Figure 1:
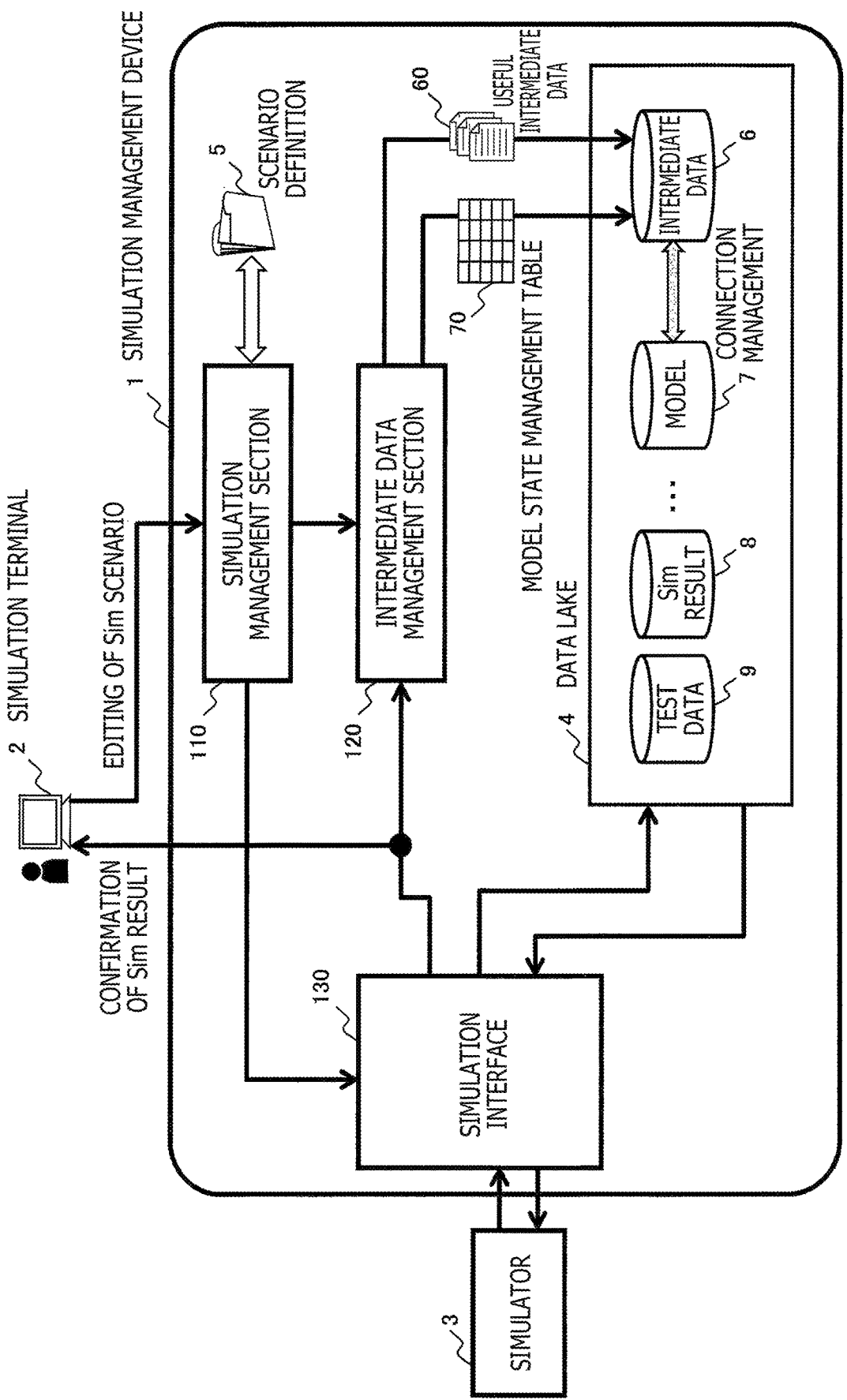
FIG. 1 is a block diagram depicting an embodiment of the present invention and depicting an example of a simulation system.

FIG. 1 is a block diagram depicting an embodiment of the present invention and depicting an example of a simulation system for managing a simulator that interlocks a plurality of models. The simulation system is configured such that a simulator 3 that executes a simulation by interlocking a plurality of models, a simulation management device 1 that manages the simulation, and a simulation terminal 2 that issues an instruction of the simulation and that displays a simulation result (analysis result) are connected to one another by a network that is not depicted.

The simulation terminal 2 is a computing machine operated by a user (or an administrator) of the simulation system, issues instructions of a scenario definition to be executed, models to be used, start of a simulation, and the like, and displays the simulation result.

The simulation management device 1 includes a simulation management section 110 that issues a command to execute a simulation to the simulator 3, an intermediate data management section 120 that receives the simulation result and model state information (intermediate data) from the simulator 3 and that extracts usable state information as useful intermediate data 60, a simulation interface 130 that communicates with the simulator 3, and a data lake 4 that accumulates data. While an example in which the simulation management device 1 includes the data lake 4 is described in the present embodiment, the data lake 4 may be located outside of the simulation management device 1.

The simulation management section 110 acquires a scenario definition 5 to be executed by the simulator 3, models to be simulated, test data 9, and the useful intermediate data 60 based on a position of starting a simulation, from the data lake 4 on the basis of the instruction received from the simulation terminal 2, and issues a command to the simulator 3 via the simulation interface 130.

Upon receiving the simulation result and the model state information from the simulator 3 (or a foundation platform), the simulation interface 130 transfers the simulation result and the model state information to the intermediate data management section 120 and the simulation terminal 2. The simulation interface 130 also transfers the data and the command from the simulation management section 110 to the simulator 3.

The intermediate data management section 120 stores the simulation result received from the simulator 3 via the simulation interface 130 in a simulation result 8 in the data lake 4, and stores the state information about each model received from the simulator 3 in intermediate data 6 in the data lake 4. It is noted that the state information about each model is configured with, for example, a value that indicates an internal state of the model.

The intermediate data management section 120 then extracts reusable data from the intermediate data 6 at predetermined timing, and stores the extracted data in the data lake 4 as the useful intermediate data 60. The intermediate data management section 120 registers the extracted useful intermediate data 60 in a model state management table 70 that manages the useful intermediate data 60 so that the useful intermediate data 60 is associated with a state transition diagram of the models to be simulated and each model to be simulated. It is noted that the predetermined timing is preset timing such as time at which the simulation management device 1 receives an instruction from the user or the like of the simulation system or a predetermined cycle.

The simulation management section 110 refers to the scenario definition 5, acquires usable model data from the useful intermediate data 60, and reuses the acquired model data in a simulation at a time of starting the simulation.

Figure 2:
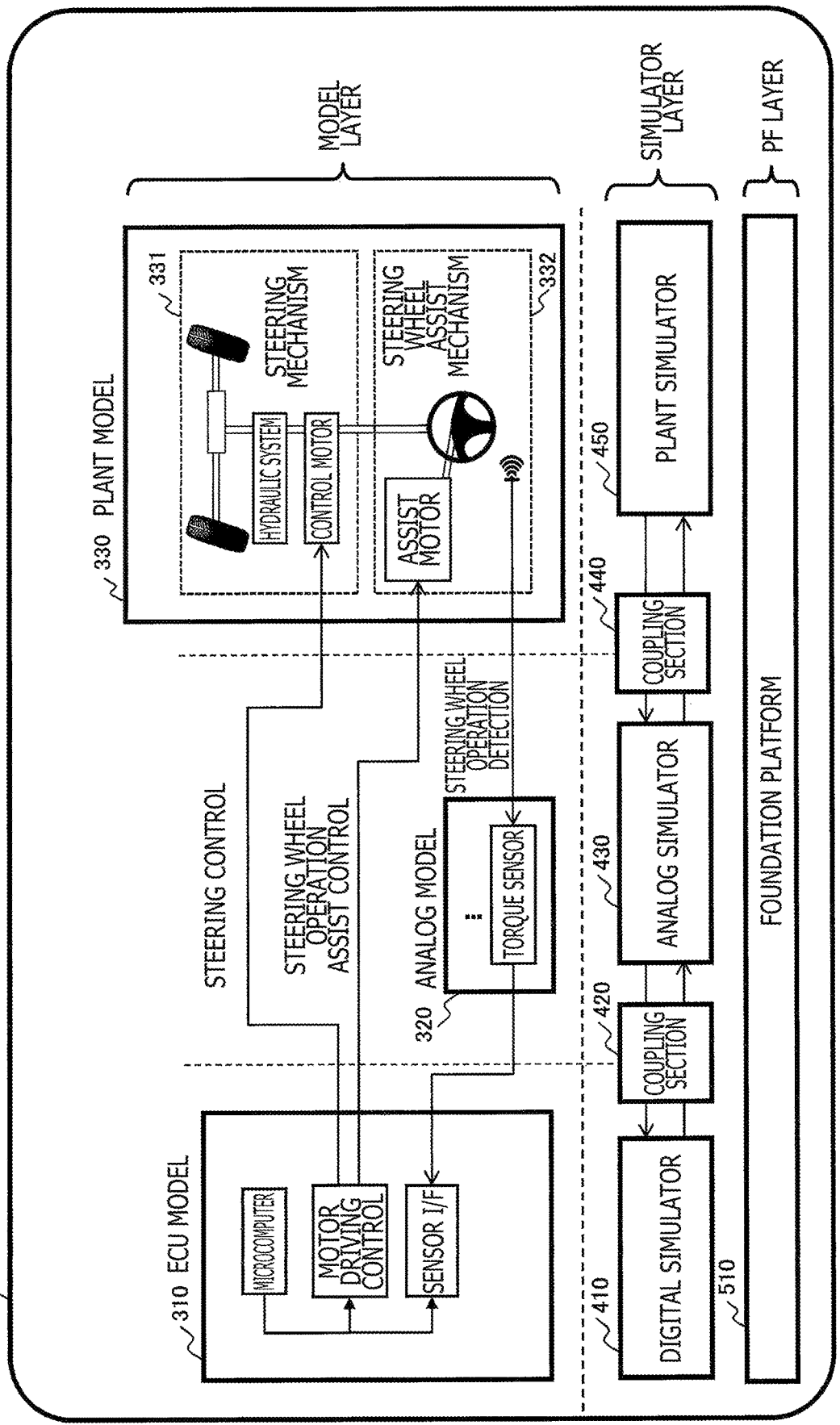
FIG. 2 is a block diagram depicting the embodiment of the present invention and depicting an example of a simulator.

FIG. 2 is a block diagram depicting the embodiment of the present invention and depicting an example of the simulator 3 that interlocks a plurality of models. In the present embodiment, an example of applying the simulation system of the present invention to a vehicle power steering device will be described.

The power steering device to be simulated includes three models that are an electronic control unit (ECU) model 310, an analog model 320, and a plant model 330.

In the simulator 3, a plurality of types of simulators are running on a foundation platform 510. In the present embodiment, a digital simulator 410 that simulates the ECU model 310, an analog simulator 430 that simulates the analog model 320, and a plant simulator 450 that simulates the plant model 330 are running on the foundation platform 510.

Furthermore, on the foundation platform 510, a coupling section 420 that interlocks the digital simulator 410 with the analog simulator 430 and a coupling section 440 that interlocks the analog simulator 430 with the plant simulator 450 are also running. It is noted that the coupling sections 420 and 440 may be allowed to function in a case of carrying out a coupling analysis.

The foundation platform 510 causes each of the simulators 410, 430, and 450 to execute a simulation of each of the models 310, 320, and 330 on the basis of the command from the simulation management device 1, and transmits a simulation result and intermediate data to the simulation management device 1 upon acquiring the simulation result and the intermediate data from each simulator. While an example of realizing the simulator 3 by one computing machine is described in the present embodiment, the simulators 410, 430, and 450 in the simulator 3 may be executed by different computing machines.

The plant model 330 includes a steering mechanism model 331 and a steering wheel assist mechanism model 332. The steering mechanism model 331 includes a control motor model that drives a hydraulic system model. The steering wheel assist mechanism model 332 includes an assist motor model and a torque sensor model. The analog model 320 includes a torque sensor and detects a steering wheel operation.

The ECU model 310 includes a microcomputer model, a motor control section model, and a sensor interface model, and exercises steering control and steering wheel operation assist control.

The simulation system according to the present embodiment carries out a simulation for analyzing behaviors of a plurality of models including the ECU model 310, the analog model 320, and the plant model 330 by interlocking the plurality of models.

The simulation management device 1 connects variations in each model and the data (useful intermediate data 60) indicating the internal state of each model in a typical status (standby state or steady state) that occurs with a high frequency to a status on the state transition diagram of the model, and manages the variations and the useful intermediate data 60 in the model state management table 70.

Upon receiving each model for use in a simulation, the variations in each model, and the status of each model from the simulation terminal 2, the simulation management device 1 according to the present embodiment can identify the useful intermediate data 60 indicating the internal states of the model occurring in previous simulations.

By identifying each model to be simulated and identifying the status of the model, the simulation management device 1 can cause the simulator 3 to start a simulation from the standby state or the steady state on the state transition diagram.

In other words, the simulation management device 1 can cause the simulator 3 to start a simulation from the standby state or the steady state in the middle of a scenario without starting over the simulation from the beginning, by replacing the plurality of models and setting the preset useful intermediate data 60 indicating the standby state or the steady state to each model to be used by the simulator 3. It is thereby possible to shorten simulation execution time and easily make attempts of many combinations of models in a short time.

Figure 3:
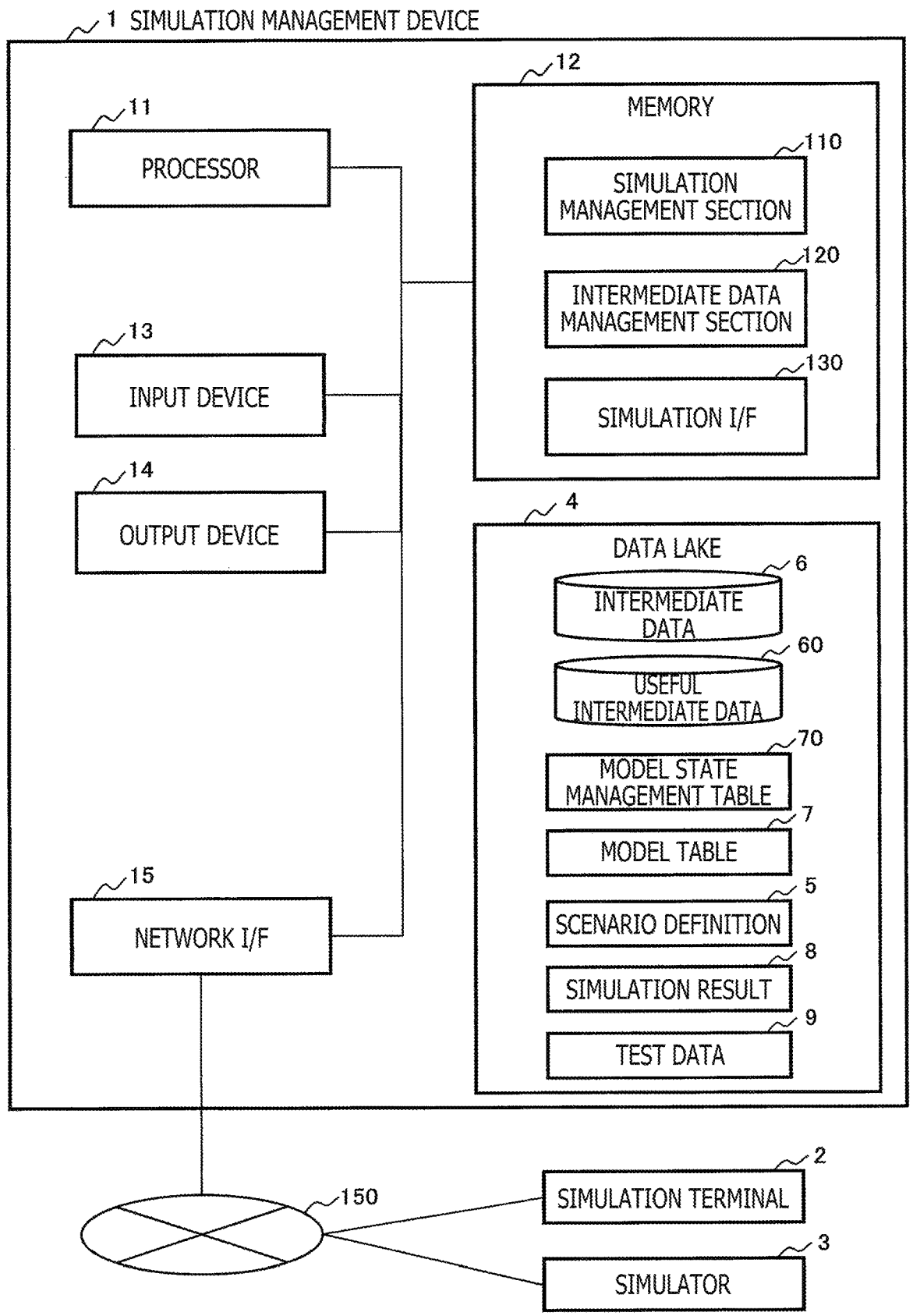
FIG. 3 is a block diagram depicting the embodiment of the present invention and depicting an example of a simulation management device.

FIG. 3 is a block diagram depicting an example of the simulation management device 1. The simulation management device 1 is a computing machine that includes a processor 11, a memory 12, an input device 13, an output device 14, a network interface 15, and the data lake 4.

The input device 13 is configured with, for example, a mouse, a keyboard, or a touch panel. The output device 14 is configured with a display or the like. The network interface 15 is connected to a network 150 and communicates with the simulation terminal 2 and the simulator 3.

The simulation management section 110, the intermediate data management section 120, and the simulation interface 130 are stored in the memory 12 as programs, and executed by the processor 11.

The processor 11 runs as a functional section that provides a predetermined function by executing a process in accordance with each program corresponding to each functional section. For example, the processor 11 functions as the simulation management section 110 by executing a process in accordance with a simulation management program. The same thing is true for the other programs. Moreover, the processor 11 runs also as a functional section that provides functions of a plurality of processes executed by the programs. The computing machine and the computing machine system are an apparatus and a system each including these functional sections.

The data lake 4 is configured with a storage device including one or more nonvolatile storage mediums. The data lake 4 contains the intermediate data 6 that is state information about each model that is being simulated, the useful intermediate data 60 extracted from the intermediate data 6, the model table 7 that stores information about each model used in a simulation, the model state management table 70 that manages a relationship among the useful intermediate data 60, each model, and the state transition diagram, the scenario definition 5 to which scenarios of the simulation are set, and the test data 9 storing data for use in the simulation.

The scenario definition 5 contains the scenarios of the simulation and the state transition diagram of the model for use in the simulation. The scenario definition 5 is data preset by the user or the like of the simulation system and contains procedures of the simulation, the state transition diagram, the data to be used, and the like.

Figure 4:
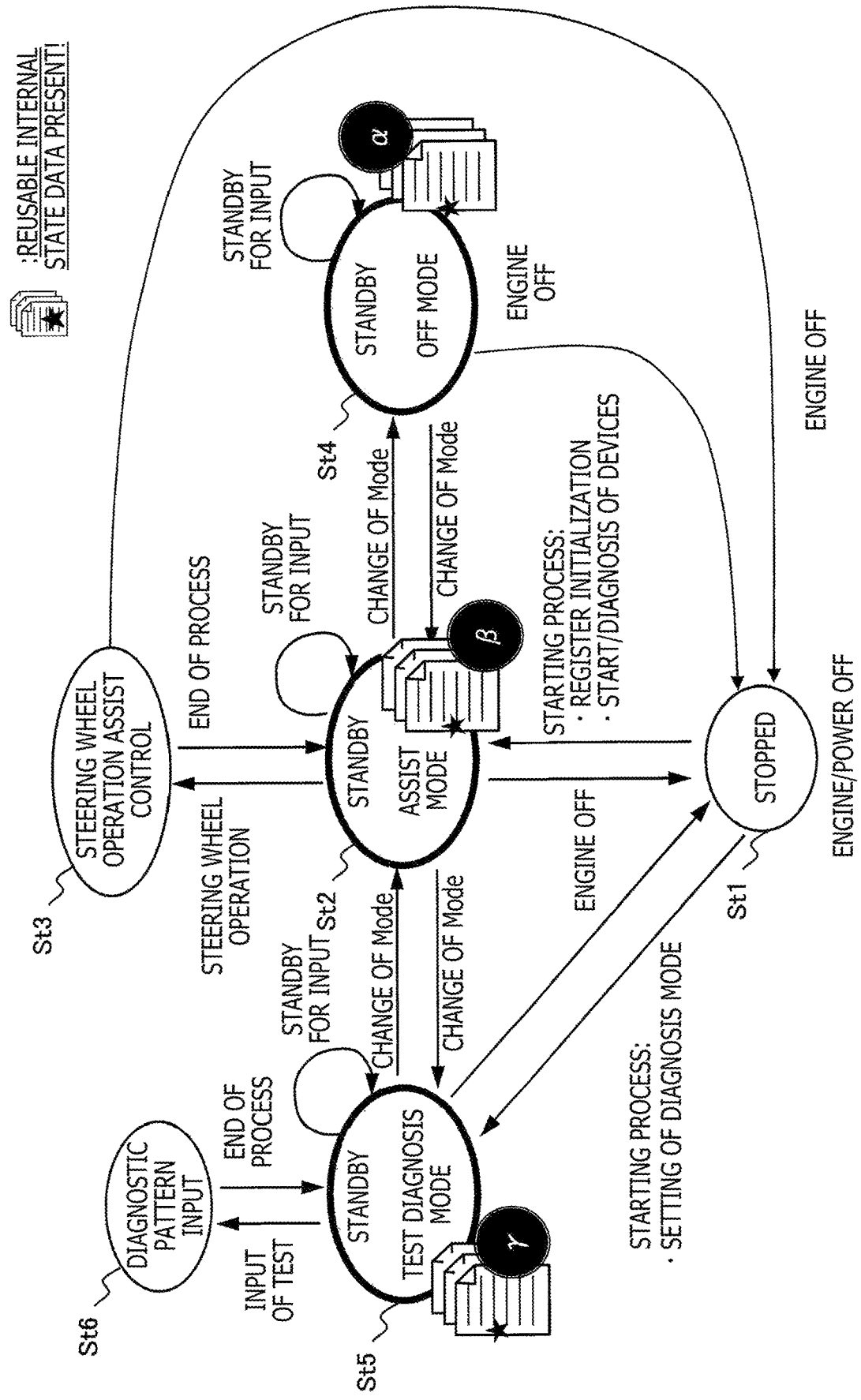
FIG. 4 is a state transition diagram depicting the embodiment of the present invention and depicting a power steering system to be simulated.

FIG. 4 depicts an example of a state transition diagram of the power steering system. The state transition diagram is information preset by the user, the administrator, or the like of the simulation system from description of a design document, specifications, or the like.

In the state transition diagram of the power steering system according to the present embodiment, a stopped state (St1) in which an engine and a motor are stopped is assumed as a starting point. When a driver turns on an ignition key of the vehicle in the stopped state (St1), the stopped state (St1) transitions to an assist mode standby state (St2), in which the power steering system is on standby for receiving a steering wheel operation or a mode change.

It is assumed in the present embodiment that the standby state (or steady state) is a state in which an input is constant or the power steering system is on standby for an input and in which an output is constant or zero. In other words, a value that indicates the internal state of the model in a case of the standby state may satisfy a predetermined condition such as constant or zero.

When the steering wheel operation is received in the assist mode standby state (St2), the assist mode standby state (St2) transitions to steering wheel operation assist control (St3), and the steering control and the steering wheel operation assist control are exercised. Upon completion with the steering control and the assist control, the state returns to the assist mode standby state (St2).

Furthermore, when the driver turns off the ignition key in the assist mode standby state (St2), the assist mode standby state (St2) returns to the stopped state (St1).

When the mode change of changing over an assist mode to an OFF mode is made in the assist mode standby state (St2), the assist mode standby state (St2) transitions to an OFF mode standby state (St4). The OFF mode standby state (St4) transitions to either the assist mode standby state (St2) by the mode change or the stopped state (St1) by driver's turning off the ignition key.

Moreover, when the mode is changed to a test diagnosis mode by the mode change in the assist mode standby state (St2), the assist mode standby state (St2) transitions to a test diagnosis mode standby state (St5). In the test diagnosis mode standby state (St5), a diagnosis is carried out in a diagnostic pattern input (St6) in response to a test input. Furthermore, upon completion with the diagnosis, the state transitions to the test diagnosis mode standby state (St5).

The test diagnosis mode standby state (St5) transitions to the stopped state (St1) by driver's turning of the ignition key. It is noted that the stopped state (St1) can transition to the test diagnosis mode standby state (St5) by driver's turning on the ignition key while performing a specific operation in the stopped state (St1).

The simulation management device 1 according to the present embodiment identifies the status of either the standby state or the steady state on the state transition diagram, and extracts the intermediate data 6 that matches the identified status as the useful intermediate data 60. The simulation management device 1 then connects the useful intermediate data 60 to the model and the status, and stores and manages the useful intermediate data 60 in the model state management table 70.

In the state transition diagram of FIG. 4, the assist mode standby state (St2) is set as a specific status β, the OFF mode standby state (St4) is set as a specific status α, and the test diagnosis mode standby state (St5) is set as a specific status γ.

Furthermore, in these statuses α to γ, the useful intermediate data 60 is extracted, managed in the model state management table 70, and made reusable in a later simulation, as described later.

Figure 5:
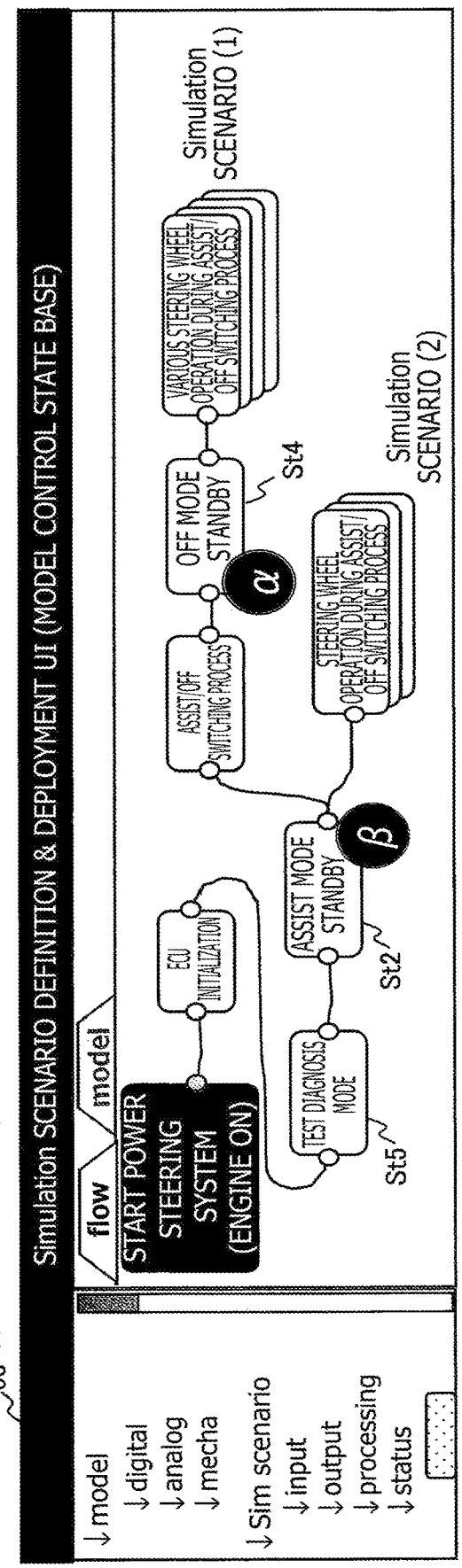
FIG. 5 depicts the embodiment of the present invention and depicts an example of a scenario definition.

FIG. 5 depicts an example of the scenario definition 5 for carrying out a simulation of the power steering system. The scenario definition 5 is configured with contents and procedures of a series of attempts preset by the user, the administrator, or the like of the simulation system from the description of the design document, the specifications, or the like. The scenario definition 5 of FIG. 5 depicts an example of a screen displayed on a display device or the like of the output device 14 or the simulation terminal 2.

In the example of FIG. 5, a simulation is started by starting the power steering system, the state transitions to the test diagnosis mode standby state (St5) after ECU initialization, and the test diagnosis mode standby state (St5) transitions to the assist mode standby state (St2). In Scenario (1), the procedure of the simulation is then set such that the mode is switched over to the OFF mode, the assist mode standby state (St2) then transitions to the OFF mode standby state (St4), and the steering wheel operation is subsequently received in the OFF mode.

On the other hand, in Scenario (2), the procedure of the simulation is then set such that the mode is switched over to the OFF mode next to the assist mode standby state (St2), and the steering wheel operation is then received.

Moreover, in FIG. 5, it is displayed that the OFF mode standby state (St4) is the specific status α and the assist mode standby state (St2) is the specific status β. In the scenario definition 5, a state of displaying each specific status indicates that the useful intermediate data 60 is present, in other words, explicitly indicates that a simulation can be started from a position of the specific status.

FIG. 6 depicts an example of the model state management table 70. The model state management table 70 is generated by the intermediate data management section 120, as described later.

In the model state management table 70, each entry contains: a model name 71 storing a type and a name of each model; version information 72 storing information about a software version, hardware specifications, and the like; a state model 73 indicating information about (identifier of) a status and a storage position of the information; and remarks for reference 74 storing items of usage restrictions and the like.

During a product development period, attempts are often made to simulate ECUs different in type, firmware, or manufacturer. Owing to this, differences in model are managed by adding not only the type name 71 but also the information that indicates a difference in specifications such as a version of firmware or the like.

The state model 73 stores the identifier (α, β, or γ) of the status on the state transition diagram depicted in FIG. 4 and a file ID of the useful intermediate data 60 corresponding to the status. It is indicated, for example, that the useful intermediate data 60 corresponding to the status α (St4) on the state transition diagram of a model that has the type name 71="EU01" and the version information 72="V001" is stored in the file ID="V001_1."

The model state management table 70 can manage different file IDs of the useful intermediate data 60 as many as pieces of the version information 72 corresponding to the type name 71 in such a manner that the file IDs are associated with each status. The user or the like of the simulation system can thereby study contents of one model changing during the development period. Furthermore, a combination of a plurality of models having different version information 72 can be simulated by the simulator 3, and an optimum combination of models can be searched.

While an example of storing the file ID of the useful intermediate data 60 in the state model 73 in the model state management table 70 has been described above, a path that indicates a storage position of the useful intermediate data 60, a file name, or the like can be stored in the state model 73. Alternatively, the useful intermediate data 60 may be stored in the state model 73.

FIG. 7 depicts an example of the model table 7. The model table 7 is information preset by the user or the like of the simulation system. The model table 7 contains a kind 75 of each model, a type name 76 of the model, and a file ID 77.

It is noted that the type name 76 of the model may contain the version information indicating the difference in specifications of software or hardware. The file ID 77 may be configured with an identifier of a file that stores data about the model.

Figure 8:
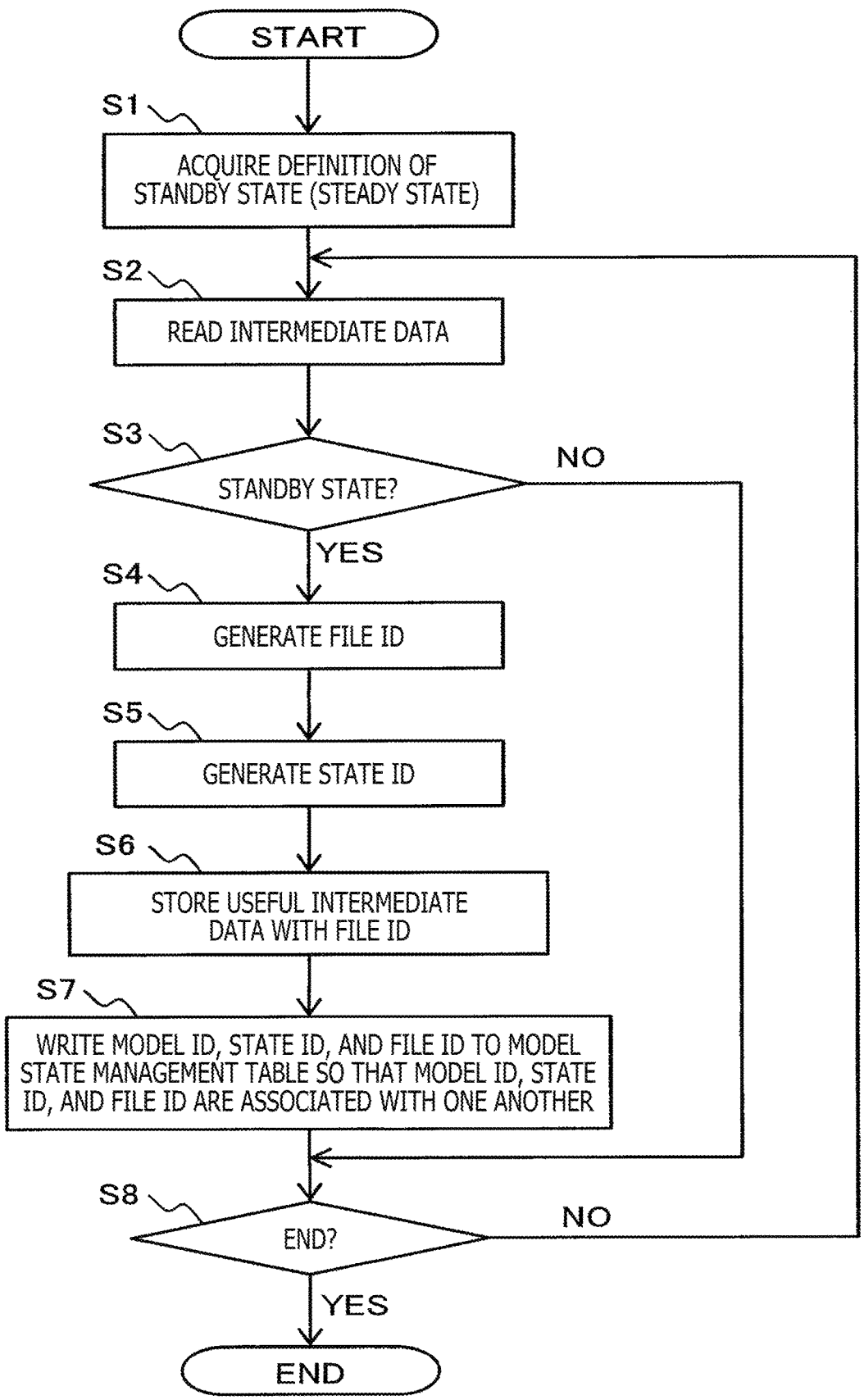
FIG. 8 is a flowchart depicting the embodiment of the present invention and depicting an example of a process for extracting useful intermediate data performed by the simulation management device.

FIG. 8 is a flowchart depicting an example of a process for extracting the useful intermediate data 60 performed by the intermediate data management section 120. This process is executed on the basis of an instruction from the user of the simulation system.

In Step S1, the intermediate data management section 120 acquires the definition of the standby state (or steady state) for each model for which the useful intermediate data 60 is to be extracted. The intermediate data management section 120 can use a file, an input from the input device 13, or the like to acquire the standby state. As for the definition of the standby state, each standby state can be preset per model in the model table 7. Furthermore, the standby state indicates the state in which the value indicating the internal state of the model satisfies the predetermined condition such as constant or zero as described above.

In Step S2, the intermediate data management section 120 reads the intermediate data 6 about the model for which the useful intermediate data 60 is to be extracted, from the data lake 4. In Step S3, the intermediate data management section 120 determines whether the read intermediate data 6 matches the standby state (or steady state) read in Step S1. The intermediate data management section 120 goes to Step S4 in a case of determining that the intermediate data 6 matches the standby state, and goes to Step S8 in a case of determining that the intermediate data 6 does not match the standby state.

In Step S4, the intermediate data management section 120 generates the file ID with which the intermediate data 6 is stored. The file ID may be a unique identifier within the simulation system.

In Step S5, the intermediate data management section 120 generates the state ID of the standby state matched by the intermediate data 6. The state ID may be a unique identifier within the model.

In Step S6, the intermediate data management section 120 determines the intermediate data 6 that matches the standby state as the useful intermediate data 60, and stores the useful intermediate data 60 in the data lake 4 with the generated file ID.

Next, in Step S7, the intermediate data management section 120 writes the ID of the model (model ID), the state ID, and the file ID in the model state management table 70 so that the model ID, the state ID, and the file ID are connected to one another. It is noted that the version information 72 may be added to the model ID as depicted in the model state management table 70 of FIG. 6.

In the model state management table 70 of FIG. 6, the type name 71 and the version information 72 configure the model ID, α, β, or γ in the state model 73 is the state ID, and each of (V001_1) to (V023_3) is the file ID. It is noted that the intermediate data management section 120 receives the model ID at a time of receiving the standby state in Step S1.

In Step S8, the intermediate data management section 120 determines whether the intermediate data 6 to be processed next is present as an end condition. In a case in which unprocessed intermediate data 6 is present, the intermediate data management section 120 returns to Step S2 and repeats the process described above. In a case in which the unprocessed intermediate data 6 is not present, the intermediate data management section 120 ends the process.

Through the process, the intermediate data management section 120 extracts the value that matches the standby state (or steady state) of each model on the state transition diagram from the intermediate data 6 as the useful intermediate data 60, stores the useful intermediate data 60 in the data lake 4, assigns the state ID to this useful intermediate data 60, and stores the useful intermediate data 60 in the model state management table 70 so that the useful intermediate data 60 is associated with the model ID. The useful intermediate data 60 about the standby state (or steady state)

is thereby added to the model state management table 70 per model and per version information 72.

Furthermore, since the useful intermediate data 60 can be connected to one model using a plurality of pieces of version information 72 for one type name 71, it is possible to carry out a simulation from a plurality of modes of one model and select a combination of models to be simulated in accordance with a progress of development.

While it has been described in the embodiment that the standby state is the state in which the value indicating the internal state of each model satisfies the predetermined condition such as constant or zero, the standby state is not limited to such a case. The intermediate data management section 120 can determine that the intermediate data 6 matches the standby state if some of values indicating the internal states of each model satisfy a preset attention condition.

For example, in a case in which three values of A, B, and C are present as internal states of each model, a condition for using the preset values A and B as values for determination of the standby state and for excluding the value C from the determination is assumed as the attention condition. The intermediate data management section 120 receiving the attention condition determines the standby state by the values A and B of the internal state and ignores the value C. It is thereby possible to omit (exclude) determination related to the value that does not affect a simulation and increase the intermediate data 6 usable as the useful intermediate data 60 even in a case in which all the internal states do not match the standby state.

It is noted that the attention condition can be set as appropriate by the user or the like of the simulation system in response to characteristics of each model or contents of a simulation. Furthermore, the intermediate data management section 120 may read the attention condition in Step S1.

Figure 9:
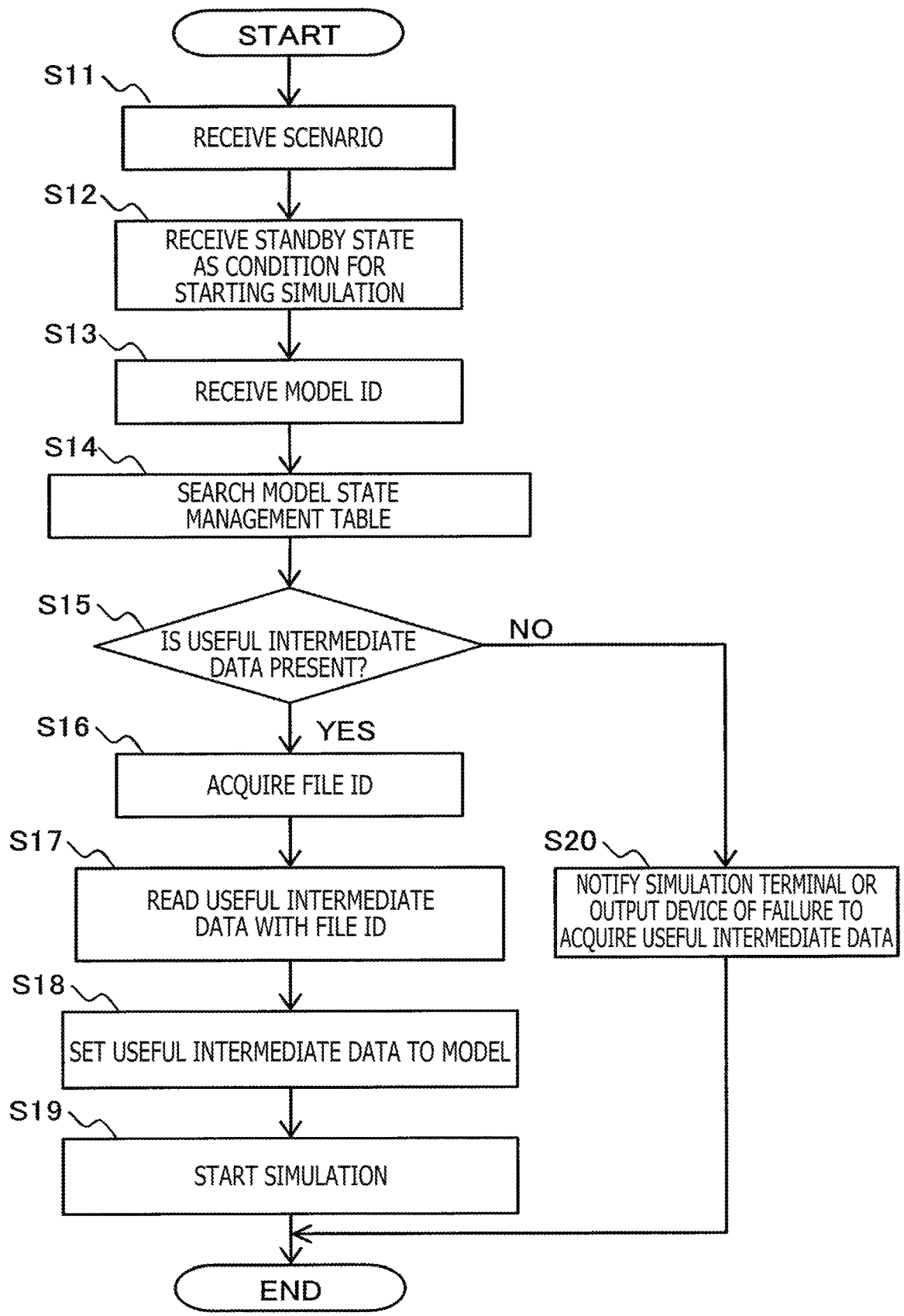
FIG. 9 is a flowchart depicting the embodiment of the present invention and depicting an example of a process for starting a simulation from a standby state performed by the simulation management device.

FIG. 9 is a flowchart depicting an example of a process for starting a simulation performed by the simulation management section 110. This process is started in response to a command from the simulation terminal 2 or the input device 13.

In Step S11, the simulation management section 110 acquires the scenario definition 5 received by the simulation terminal 2 or the input device 13 from the data lake 4, and reads a scenario for executing a simulation.

In Step S12, the simulation management section 110 receives the standby state (or steady state) from the simulation terminal 2 or the input device 13 as a condition for starting a simulation. Next, in Step S13, the simulation management section 110 receives the model ID such as the type name 71 and the version information 72 from the simulation terminal 2 or the input device 13 as a condition for starting the simulation.

In Step S14, the simulation management section 110 searches the model state management table 70 for the useful intermediate data 60 corresponding to the received model ID such as the type name 71 and the received version information 72 and the standby state.

Next, in Step S15, the simulation management section 110 determines whether the useful intermediate data 60 is present. The simulation management section 110 goes to Step S16 in a case in which the useful intermediate data 60 corresponding to a search condition is present, and goes to Step S20 in a case in which the useful intermediate data 60 corresponding to the search condition is not present.

In Step S16, the simulation management section 110 acquires the file ID of the useful intermediate data 60 from an entry corresponding to a search result in the model state management table 70. In Step S17, the simulation management section 110 then reads data about the file ID from the useful intermediate data 60 within the data lake 4. Furthermore, the simulation management section 110 reads the model corresponding to the model ID such as the type name 71 and the version information 72 from the model table 7.

In Step S18, the simulation management section 110 sets the useful intermediate data 60 to the model and makes preparations for a simulation such as reading of the test data. In Step S19, the simulation management section 110 instructs the simulator 3 to execute a simulation by providing the model, the useful intermediate data 60, and the test data 9.

On the other hand, in a case of determining in Step S15 that the useful intermediate data 60 is not present in the model state management table 70, the simulation management section 110 goes to Step S20 to notify the simulation terminal 2 or the output device 14 of a failure to acquire the useful intermediate data 60.

Through the process described above, the simulation management section 110 manages the useful intermediate data 60 extracted from the previous intermediate data 6 and matching the standby state (or steady state) in the model state management table 70 so that the useful intermediate data 60 is associated with each model and the standby state (or steady state), thereby making it possible to combine desired models and start a simulation from a desired standby state (or steady state).

Figure 10:
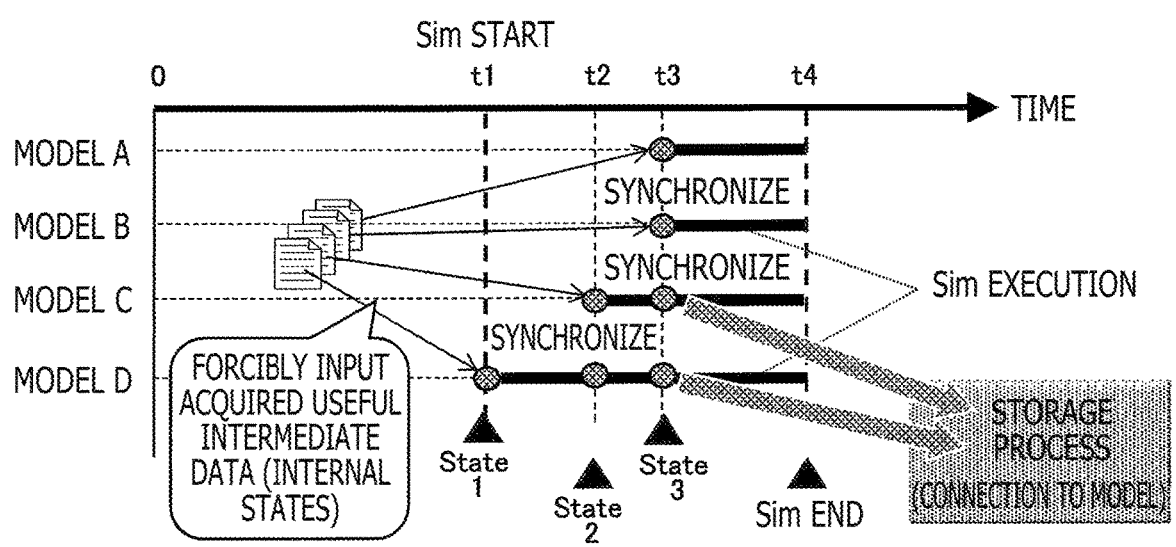
FIG. 10 is a time chart depicting the embodiment of the present invention and depicting a state of starting a simulation.

FIG. 10 is a time chart depicting an example of starting a simulation in the middle of the scenario definition 5. In FIG. 10, the example of performing a simulation while interlocking four models of models A to D is described.

The simulation management section 110 acquires the useful intermediate data 60 at starting positions of the models A to D from the model state management table 70 and sets the useful intermediate data 60 to each of the models A to D. The simulation management section 110 then instructs the simulator 3 to start a simulation on the basis of the scenario definition 5.

First, at time t1, a simulation of the model D is started from a first standby state (State 1). Next, at time t2, a simulation of the model C is started from a second standby state (State 2). In this second standby state (State 2), synchronization is performed to transmit the internal state of the model D to the internal state of the model C.

At time t3, a simulation of each of the models A and B is started from a third standby state (State 3). In this third standby state (State 3), synchronization is performed to transmit the internal states of the models C and D to the internal states of the models A and B.

In a case in which the useful intermediate data 60 about the models C and D is not present in the third standby state (State 3) at the time t3, the intermediate data management section 120 can store the internal states of the models C and D at the time t3 as the useful intermediate data 60 while connecting the useful intermediate data 60 to the model ID and the standby state of each model.

As described above, the simulation management device 1 according to the present embodiment can start a simulation from a desired standby state and shorten time required for the simulation by applying the useful intermediate data 60 to each model in the standby state in the middle of the scenario definition 5.

Furthermore, since the simulation management device 1 according to the present embodiment can change a combination of models and start a simulation from the standby state in the middle of the scenario definition 5, it is unnecessary to start over the simulation from the beginning in a case of changing the combination of models as in the conventional technique. Therefore, it is possible to greatly shorten the time required for the simulation. This can greatly contribute to great reductions in a cost and time required for development.

CONCLUSION

As described so far, the simulation system according to the present embodiment can be configured as follows.

(1) A simulation management method for managing data for use in a simulation by a management device (simulation management device 1) having a processor (11) and a memory (12), the simulation management method including: a first step of executing the simulation by providing each model and data to a simulator (3), and acquiring intermediate data (6) indicating an internal state of the model, by the management device (1); a second step of extracting the intermediate data (6) matching a preset predetermined state (standby state), and holding the extracted intermediate data (6) as useful intermediate data (60), by the management device (1); and a third step of storing the predetermined state (standby state), an identifier of the model, and the useful intermediate data (60) in model state management information (model state management table 70) so that the predetermined state (standby state), the identifier of the model, and the useful intermediate data (60) are associated with one another, by the management device (1).

By the process described above, the value that matches the standby state (or steady state) of each model on the state transition diagram is extracted from the intermediate data 6 and stored in the data lake 4 as the useful intermediate data 60, the state ID is assigned to the useful intermediate data 60, and the useful intermediate data 60 is stored in the model state management table 70 so that the useful intermediate data 60 is associated with the model ID. The useful intermediate data 60 about the standby state (or steady state) is thereby added to the model state management table 70 per model and per version information 72.

Furthermore, since the useful intermediate data 60 can be connected to one model using a plurality of pieces of version information 72 for one type name 71, it is possible to carry out a simulation from a plurality of modes of one model and select a combination of models to be simulated in accordance with a progress of development.

(2) The simulation management method according to (1), the second step including extracting the intermediate data (6) indicating that the internal state of the model matches a preset standby state or steady state.

By the process described above, the simulation management device 1 can extract the value matching the standby state (or steady state) of each model on the state transition diagram from the intermediate data 6 as the useful intermediate data 60 and manage the useful intermediate data 60 while connecting the useful intermediate data 60 to the model and the standby state.

Connecting the useful intermediate data 60 to the standby state (or steady state) on the state transition diagram makes it possible to start a simulation from the standby state.

(3) The simulation management method according to (1), further including: a fourth step of receiving an identifier (type name 71 and version information 72) of each model and the predetermined state (standby state) as a condition for starting the simulation, by the management device (1); a fifth step of searching the model state management information (70) using the received identifier (71, 72) of the model and the predetermined state (standby state), and acquiring the useful intermediate data (60), by the management device (1); and a sixth step of setting the acquired useful intermediate data (60) to the model, and issuing a command to start a simulation from the predetermined state (standby state) to the simulator (3), by the management device (1).

Through the process described above, the useful intermediate data 60 extracted from the previous intermediate data 6 and matching the standby state (or steady state) is managed in the model state management table 70 so that the useful intermediate data 60 is associated with each model and the standby state (or steady state), thereby making it possible to combine desired models and start a simulation from a desired standby state (or steady state).

(4) The simulation management method according to (3), the identifier of the model in the model state management information (70) including a name (type name 71) and version information (72), and the fourth step including receiving the name (71) and the version information (72) as the identifier of the model.

(5) The simulation management method according to (5), an attention condition being used in the second step as the predetermined state (standby state), the attention condition setting a value used for determination of the preset predetermined state (standby state) and a value excluded from the determination among values indicating internal states of the model.

By using the attention condition, it is possible to omit (exclude) determination related to the value that does not affect a simulation and increase the intermediate data 6 usable as the useful intermediate data 60 even in a case in which all the internal states do not match the standby state.

The present invention is not limited to the embodiment described above and encompasses various modifications. For example, the embodiment has been described in detail for describing the present invention so that the present invention is easy to understand. The present invention is not always limited to those having all the configurations described so far. Furthermore, the configuration of the certain embodiment can be partially replaced by the configuration of the other embodiment or the configuration of the other embodiment can be added to the configuration of the certain embodiment. Moreover, for a part of the configuration of each embodiment, any of addition, deletion, and replacement of the other configurations can be applied either solely or in combination.

Furthermore, configurations, functions, processing sections, processing means, and the like described above may be realized by hardware by, for example, designing part or all thereof with integrated circuits. Moreover, the configurations, functions, and the like described above may be realized by software by causing a processor to interpret and execute programs that realize the functions. Information about a program, a table, a file, and the like for realizing each function may be placed in a recording device such as a memory, a hard disk or a solid state drive (SSD), or in a storage medium such as an integrated circuit (IC) card, a secure digital (SD) card, or a digital versatile disc (DVD).

Furthermore, control lines or information lines considered to be necessary for description are illustrated and all the control lines or the information lines are not always illustrated in terms of a product. It may be considered that almost all the configurations are actually and mutually connected.

What is claimed is:

1. A simulation management method for managing data for use in a simulation by a management device including a processor and a memory, the method comprising:
   executing the simulation using a model and data, by a simulator;
   extracting intermediate data indicating that an internal state of the model that is being simulated matches a predetermined state, and holding the extracted intermediate data as useful intermediate data, by the management device;
   receiving an identifier of the model and the predetermined state as a condition for starting the simulation, by the management device;
   acquiring the useful intermediate data from model state management information using the received identifier of the model and the received predetermined state, by the management device;
   while a scenario definition is in progress, setting the acquired useful intermediate data to the model, and issuing a command to start the simulation from the predetermined state to the simulator, by the management device; and
   starting the simulation from the predetermined state to the simulator to shorten time required for the simulation.

2. The simulation management method according to claim 1, wherein
   the simulation is a simulation using a plurality of models, and
   the management device holds the useful intermediate data for each of the models.

3. The simulation management method according to claim 2, comprising:
   receiving identifiers of the plurality of the models and the predetermined states corresponding to the plurality of models as a condition for starting the simulation, by the management device;
   acquiring a plurality of pieces of the useful intermediate data from the model state management information using the received identifiers of the plurality of models and the received predetermined states, by the management device; and
   setting the plurality of pieces of acquired useful intermediate data to the models, and issuing a command to start the simulation from the predetermined states by synchronizing the plurality of models to the simulator, by the management device.

4. The simulation management method according to claim 2, comprising:
   causing a state of at least one of the plurality of models to transition to the predetermined state after setting the plurality of models, and synchronizing the plurality of models after state transition.

5. The simulation management method according to claim 1, wherein
   the predetermined state is a preset standby state or a preset steady state.

6. The simulation management method according to claim 5, wherein
   the identifier of the model in the model state management information includes a name and version information, and
   the management device receives the name and the version information as the identifier of the model.

7. The simulation management method according to claim 1, wherein
   the model state management information contains the predetermined state and the identifier of the model, and
   the management device acquires the useful intermediate data corresponding to the predetermined state and the identifier of the model, and stores the useful intermediate data in the model state management information so that the useful intermediate data is associated with the predetermined state and the identifier of the model.

8. The simulation management method according to claim 7, wherein
   the model state management information contains a plurality of identifies of models, and a plurality of the predetermined states are associated with the each of the plurality of identifies of the models.

9. The simulation management method according to claim 1, wherein
   an attention condition setting a value used for determination of the predetermined state and a value excluded from the determination among values indicating internal states of the model, is used as the predetermined state.

10. A simulation system comprising:
    a management device including a processor and a memory; and
    a simulator executing a simulation, wherein
    the simulator
    receives a model and data and executes the simulation, and
    the management device
    extracts intermediate data indicating that an internal state of the model that is being simulated matches a predetermined state, and holds the extracted intermediate data as useful intermediate data,
    receives an identifier of the model and the predetermined state as a condition for starting the simulation,
    acquires the useful intermediate data from model state management information using the received identifier of the model and the received predetermined state,
    while a scenario definition is in progress, sets the acquired useful intermediate data to the model, and issues a command to start the simulation from the predetermined state to the simulator, and
    starts the simulation from the predetermined state to the simulator to shorten time required for the simulation.

* * * * *